United States Patent
Motohashi et al.

(10) Patent No.: US 8,030,580 B2
(45) Date of Patent: Oct. 4, 2011

(54) PRINTED WIRING BOARD AND ELECTRONIC APPARATUS INCLUDING SAME

(75) Inventors: Kenji Motohashi, Yamato (JP); Hideji Miyanishi, Yokohama (JP); Kazumasa Aoki, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 574 days.

(21) Appl. No.: 12/170,894

(22) Filed: Jul. 10, 2008

(65) Prior Publication Data

US 2009/0014206 A1 Jan. 15, 2009

(30) Foreign Application Priority Data

Jul. 13, 2007 (JP) ................... 2007-184637

(51) Int. Cl.
*H05K 1/11* (2006.01)
(52) U.S. Cl. ........ 174/262; 174/250; 361/816; 361/818; 361/767
(58) Field of Classification Search ............ 361/777, 361/799, 800, 794, 795, 808, 816, 818, 767; 174/262, 261, 255, 250, 266; 439/637, 608, 439/108, 941, 79

See application file for complete search history.

(56) References Cited

U.S. PATENT DOCUMENTS

| 2003/0123236 A1* | 7/2003 | McGrath et al. ............. 361/760 |
| 2004/0150970 A1* | 8/2004 | Lee ............................. 361/794 |
| 2005/0202722 A1* | 9/2005 | Regnier et al. ............... 439/608 |
| 2006/0091545 A1* | 5/2006 | Casher et al. ................ 257/738 |

FOREIGN PATENT DOCUMENTS

| JP | 2004-71431 | 3/2004 |
| JP | 2006-156512 | 6/2006 |
| JP | 2006-191006 | 7/2006 |

* cited by examiner

*Primary Examiner* — Hoa C Nguyen
(74) *Attorney, Agent, or Firm* — Cooper & Dunham LLP

(57) ABSTRACT

A printed wiring board, which may be included in an electronic apparatus, includes a pair of signal pads including a first signal pad and a second signal pad formed on a front side thereof and configured to transmit differential signals, a ground pad formed at a position in proximity to the pair of signal pads, and a via configured to connect the ground pad to a ground pattern formed either on a back side or on an inner layer of the printed wiring board directly or via a lead wire led out from the ground pad. The via is located at a substantially equal position spaced away from the first signal pad and the second signal pad.

16 Claims, 7 Drawing Sheets

PRINTED WIRING BOARD AND ELECTRONIC APPARATUS INCLUDING SAME

TECHNICAL FIELD

This patent specification relates to a printed wiring board and an electronic apparatus including the printed wiring board, and more particularly, to a multilayer printed wiring board with a layout of vias that connect layers and pads for mounting electrical components, and an electronic apparatus including the above-described printed wiring board.

BACKGROUND

Recently, signals that travel on a printed wiring board, or PWB, have been transmitted with smaller amplitude in a higher frequency band.

When a PWB includes two or more layers or is otherwise multilayered, the structure of the PBW may be complex due to increases in density and number of layers of the PWB. In such PWB with a complex structure, return current paths each of which extends along corresponding signal traces may not be secured. Therefore, there is a concern that waveforms of the signals may be distorted, which can adversely affect reliability of operation of circuits or electronic components mounted on the PWB.

A related-art PWB for transmitting high-speed signals includes power patterns for power having rather stable potential and ground patterns for grounding the power, and the power patterns and the ground patterns of the related-art PWB are arranged in proximity to signal trace patterns for high frequency signals. Further, metal shielding plates may also be used to cover the PWB.

To prevent degradation of transmission quality of high-speed digital signals, a connector-conversion adapter for CD-ROM device employs a PWB having the above-described construction so that a positioning hole of the PWB may be formed according to a through-hole structure and a metal film that forms the positioning hole may be connected to multiple ground patterns. Specifically, the metal film forming a part of the through-hole structure of the CD-ROM device is connected to three ground patterns, which have been separately connected, so that the metal film of the through-hole structure may be included in the ground patterns. By so doing, a ground potential is enhanced to prevent high-speed digital signals from being degraded while being transmitted through the connector-conversion adapter.

It is required that signals traveling over the PWB further increase their transmission speed. To meet such demand, recent PWBs intend to employ a transmission method for high-speed differential signals, such as Serial-ATA and PCI-Express. As noted above, for multilayer PWBS, the structure thereof has become more complex due to increases in the density and number of layers, and therefore it has been difficult to secure return current paths extending along respective signal traces, which can adversely affect the operating reliability of the circuits or electronic components mounted on the PWB.

To eliminate the above-described drawbacks, multilayer PWBs for carrying high-speed signals include a power layer that holds rather stable potential and a ground layer that is arranged in proximity to a layer having signal traces for high frequency signals so as to secure the return current paths. When the PWB includes a double-sided structure, the ground pattern may be provided on a back side of the PWB. When the PWB is multilayered, the ground pattern may be provided on a second, intermediate layer, which is an internal conductive layer.

With the above-described structure of the PWB, when the length of a lead pattern is long, waveforms may degrade during signal transmission. For example, when signals that are transmitted at speeds of Gbps travel over an inappropriate layout of ground of a PWB, wiring delay and potential difference may be caused due to inductance in a lead wire between a ground pad of an electronic component and a via connecting to an inner layer ground pattern. Consequently, high speed differential signal traces on the PWB may experience increased loss of fidelity to waveforms in signal transmission in the high-frequency band, and therefore the output waveforms may be degraded and not have fidelity in signal transmission.

Further, regarding a distance from a lead or via to a trace pattern, when an extended end portion (including the lead wire or via) of a return current path with respect to a signal trace for high-speed differential signals is laid out carelessly, the equilibrium of high-speed differential signals may be lost, and therefore the quality or fidelity of the waveform may deteriorate.

With the construction previously described, the ground can be made stronger but the inductance from the ground pad to the through hole cannot be removed.

SUMMARY

In an aspect of this disclosure, there is provided a printed wiring board that can reduce inductance in transmission through a lead wire of an electrical component from a ground pad thereof to an inner layer ground pattern through a via and obtain equilibrium of high-speed differential signals travels on the printed wiring board.

Other example aspects of the present invention provide In another aspect, there is provided an electronic apparatus that includes the aforementioned printed wiring board.

In another aspect, a printed wiring board includes a pair of signal pads including a first signal pad and a second signal pad formed at a corresponding end of a pair of signal trace patterns on a front side thereof and configured to transmit differential signals, a ground pad formed at a position in proximity to the pair of signal pads, and a via configured to connect the ground pad to a ground pattern formed either on a back side or on an inner layer of the printed wiring board directly or through a lead wire led out from the ground pad. The via is substantially equidistant from the first signal pad and the second signal pad.

The via may be substantially equidistant from the first signal pad, the second signal pad, and the ground pad, and connected to the ground pad through the lead wire.

Both a first distance between the first signal pad and the via and a second distance between the second signal pad and the via may correspond to $(1/\sqrt{2})$ times a pitch between the first signal pad and the second signal pad.

A third distance between the ground pad and the via may correspond to $(1/\sqrt{2})$ times a pitch between the first signal pad and the second signal pad.

The ground pad may include multiple ground pads and the lead wire may include multiple lead wires corresponding to the multiple ground pads. The via may be substantially equidistant from the first signal pad, the second signal pad, and the multiple ground pads, and connected to each of the ground pads through each of the corresponding lead wires.

The via may be substantially equidistant from the first signal pad, the second signal pad, and the multiple ground pads, and connected to each of the ground pads through each of the corresponding lead wires.

The ground pad may include multiple ground pads, the lead wire may include multiple lead wires, and the via may include multiple vias configured to connect each of the multiple ground pads through each of the corresponding lead wires to the ground pattern formed either on the back side or on the inner layer of the printed wiring board through each of the lead wires led out from the corresponding ground pad. The first via of the multiple vias may be located closest to the first signal pad by a first distance and a second via of the multiple vias may be located closest to the second signal pad by a second distance substantially equal to the first distance.

The first via closest to the first signal pad may be connected to a first ground pad of the multiple ground pads and the second via closest to the second signal pad is connected to a second ground pad of the multiple ground pads. The first via may be separated from the first ground pad by a third distance and the second via separated from the second ground pad by a fourth distance substantially equal to the third distance.

Both the first distance and the second distance may correspond to $(1/\sqrt{2})$ times a pitch between the first signal pad and the second signal pad.

Both the third distance and the fourth distance may correspond to $(1/\sqrt{2})$ times the pitch between the first signal pad and the second signal pad.

Multiple pads including the first signal pad, the second signal pad, and the ground pad may be arranged in a zigzag line equidistant from each other.

Multiple pads including the first signal pad, the second signal pad, and the ground pad may be arranged in a square-shaped grid equidistant from each other.

Multiple pads, including the first signal pad, the second signal pad, and the ground pad, may be formed as a pad group for mounting an electronic component with a differential signal terminal.

The via may be formed as a via hole by a through-hole process.

The via may be formed as a conductive via including a conductive material.

The ground pattern may extend immediately below the ground pad.

Further, in an exemplary embodiment, an electronic apparatus includes the aforementioned printing wiring board.

BRIEF DESCRIPTION OF THE DRAWINGS

A more complete appreciation of the aforementioned aspects, features and advantages will be readily obtained as the same becomes better understood by reference to the following detailed description when considered in connection with the accompanying drawings, wherein.

DETAILED DESCRIPTION OF EXEMPLARY EMBODIMENTS

Figure 1:
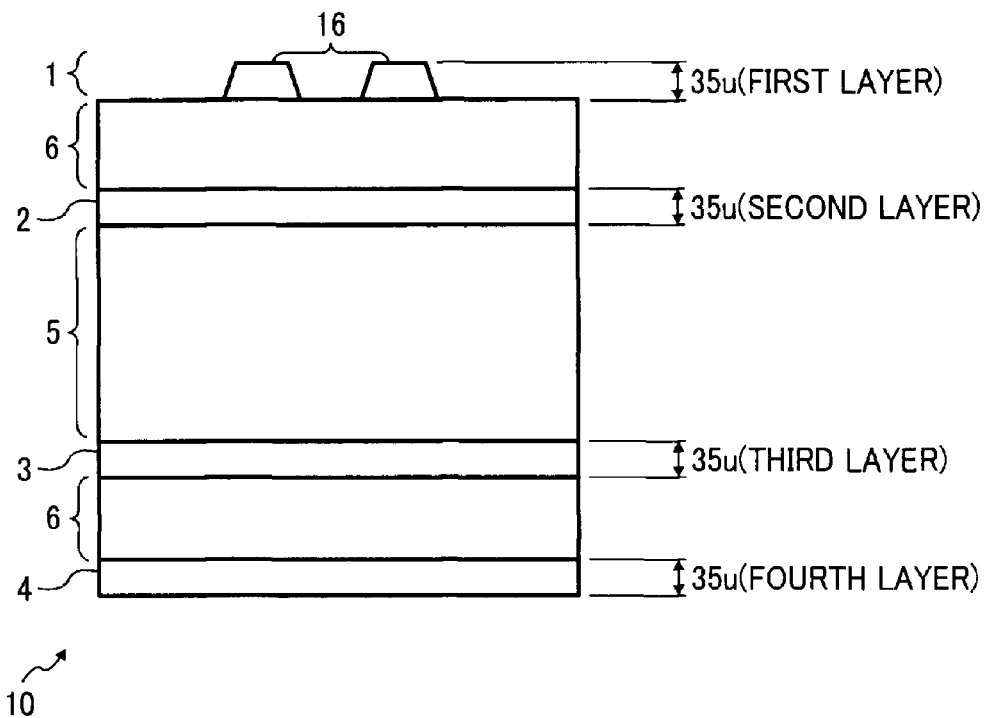
FIG. 1 is a cross sectional view of an example of a structure of a four-layer printed wiring board.

In describing exemplary embodiments illustrated in the drawings, specific terminology is employed for the sake of clarity. However, this patent specification is not intended to be limited to the specific terminology so selected and it is to be understood that each specific element includes all technical equivalents that operate in a similar manner.

Referring now to the drawings, wherein like reference numerals designate identical or corresponding parts throughout the several views, preferred embodiments of the present invention are described.

Figure 2:
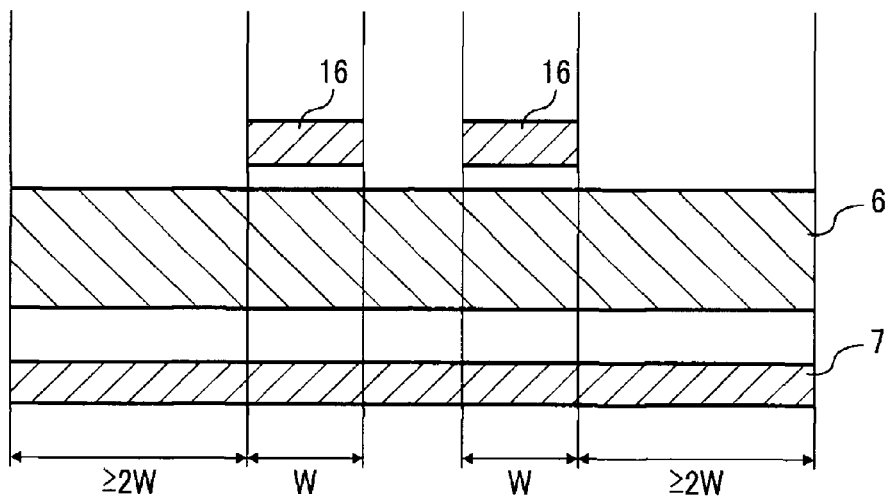
FIG. 2 is a partial cross sectional view of the four-layer printed wiring board of FIG. 1.

FIG. 1 illustrates a cross sectional view of an example structure of a four-layer PWB, and FIG. 2 illustrates a partial cross sectional view of the PWB having a differential signal pattern and an example size of a ground pattern or ground plane corresponding to the differential signal pattern.

As shown in FIG. 1, a multilayer PWB 10 includes a thin copper plate 1 as a first layer, a conductive pattern 2 as a second layer, a conductive pattern 3 as a third layer, a thin copper plate 4 as a fourth layer, a core material 5, and a prepreg 6.

The core material 5 has a thickness of from approximately 35 μm to approximately 60 μm. The conductive patterns 2 and 3 are formed respectively on front and back sides of the core material 5 of the multilayer PWB 10.

The prepreg 6 corresponds to a partially-cured thermosetting insulator having a thickness of from approximately 35 μm to approximately 60 μm. Alternatively, the prepreg 6 may include glass fibers or be formed as film.

The prepreg 6 having the thin copper plate 1 as the first layer thereon is provided on a front side of the core material 5 of the PWB 10. Further, the prepreg 6 having the thin copper plate 4 as the fourth layer thereon is provided on a back side of the core material 5 of the PWB 10.

As shown in FIGS. 1 and 2, the thin copper plate 1 forming the first layer of the PWB 10 includes a pair of high differential signal trace patterns 16. Each pattern of the pair of high differential signal trace patterns 16 has a width "W" and allows a high frequency current to flow into the ground pattern 7 included in the second layer that is strongly bonded due to capacity and inductivity, as shown in FIG. 2. At this time, it is ideal that the high frequency current flows immediately below the pair of high differential signal trace patterns 16 in the width "W", where the impedance of the high frequency current is least. However, a current that flows expanding from a region immediately below the pair of high differential signal trace patterns 16 due to complex electrical factors resides in the actual PWB 10, and therefore current loop may increase to adversely affect the operations of the PWB 10.

Therefore, it is generally preferable that a ground pattern with respect to a pair of differential signal trace patterns has a width three times greater than a width of a differential signal pattern. It is also preferable to provide a gap of 1 W between the pair of differential signal trace patterns each having a trace width W and to provide the ground pattern having a distance greater than the trace width W on both sides of the trace. It is further preferable for the differential signal trace pattern to secure a gap of 2 W or greater from another signal trace pattern.

Beside the wiring of the signal trace patterns, a PWB itself needs some considerations. PWBs such as Serial-ATA and PCI-Express, both of which employing a high speed differential signal transmission system, handle high speed signals at Gbps order and further increases their use recently. It is important for such PWB to provide an appropriate pin assignment for sophisticated electronic components to mount thereon. Regarding electronic components, pins or terminals for high-speed differential signals and pins for ground are generally assigned close to each other. For example, in signals used in the PCI-Express standard, data rate corresponds to 2.5 GBps (basic frequency: 1.25 GHzk) and a PWB and electronic components mounted on the PWB are required to perform stable, high speed operations.

Figure 3:
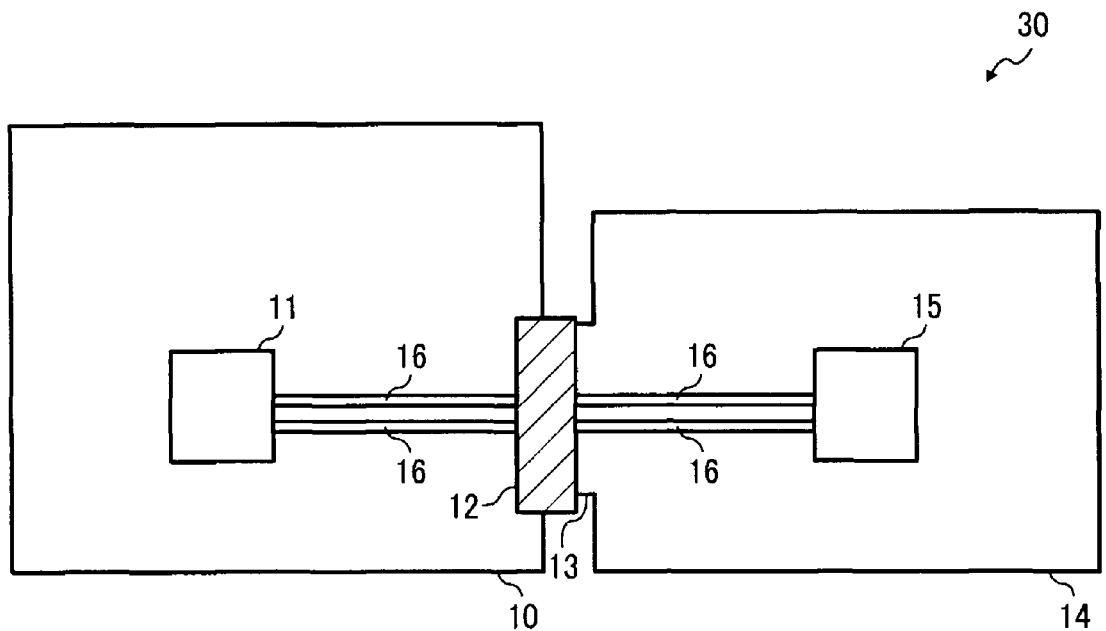
FIG. 3 is an example of the printed wiring board of FIG. 1 connected to another printed wiring board in an electronic apparatus.

FIG. 3 illustrates an example of the PWB 10 connected to a different PWB 14.

In FIG. 3, electronic components are mounted on both of the PWBs 10 and 14, which are included in an electronic apparatus 30. The electronic apparatus 30 can be any apparatus or system that employ PWBs such as the PWBs 10 and 14.

As shown in FIG. 3, the PWB 10 of the electronic apparatus 30 includes an electronic component 11, a slot connector 12, and the pair of high speed differential signal trace patterns 16, and the PWB 14 includes a card edge connector 13, an electronic component 15, and the pair of high speed differential signal trace patterns 16.

The slot connector 12 mounted on the PWB 10 and the card edge connector 13 mounted on the PWB 14 are engaged to connect the PWB 10 and the PWB 14. Accordingly, the PWB 10, the pair of high speed differential signal trace patterns 16 on the PWB 14, the slot connector 12, and the card edge connector 13 are electrically connected between the electronic component 11 mounted on the PWB 10 and the electronic component 15 mounted on the PWB 14. With the above-described connection of the PWB 10 and the PWB 14, signals may be transmitted and received through the high speed differential signal transmission system or method.

Figure 4:
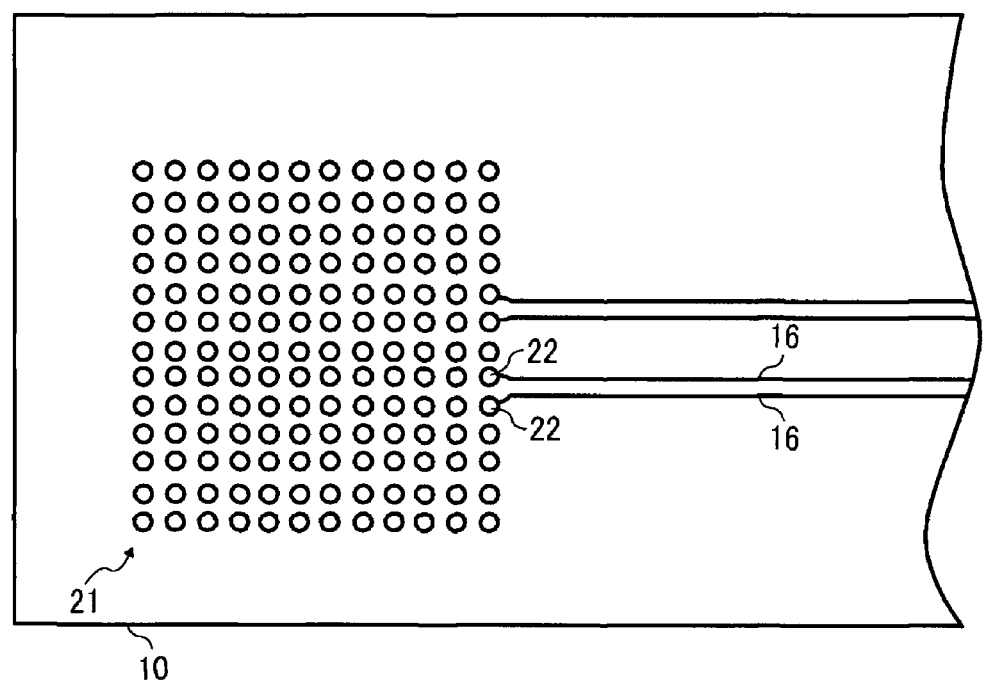
FIG. 4 is an example of a pattern layout of the printed wiring board of FIG. 3.

FIG. 4 illustrates an example pattern layout of the PWB 10 of FIG. 3. Specifically, FIG. 4 shows an example pattern layout of pads for an electronic component and signal line patterns formed on the front side of the PWB 10. The pattern layout is formed in proximity to an area on which the electronic component having a BGA (Ball Grid Array) terminal group is mounted. Vias to an inner layer ground pattern and wiring from the vias to the pads are omitted in FIG. 4.

The PWB 10 of FIG. 4 includes the pair of high differential signal traces 16 and a pad group 21 for mounting the electronic component 11. The pad group 21 is formed by multiple pads and includes a pair of signal pads 22 for transmission of high-speed differential signals. The pair of high differential signal traces 16 and the pair of pads 22 are integrally formed and electrically connected to each other. The pads of the pad group 21 on the PWB 10 are respectively assigned to signals corresponding to the pin assignment of the electronic component 11. The pair of signal pads 22 for high-speed differential signals are located adjacent to or in proximity to the pads for ground or ground pads.

For grounding the pad group 21 on the PWB 10, respective lead wires, not shown, are led out from the ground pads to connect the ground pads to a stable inner layer ground pattern. A via is arranged at one end of each lead wire so as to ground power through the via to the inner layer ground pattern.

As described above, when mounting high integration electronic components, it is general to draw or extend a small length of pattern from a pad (or a land for pin terminal) for the front side of the PWB to form a via so as to install wiring for grounding the power by the inner layer ground pattern.

In the following exemplary embodiments of this patent specification, descriptions are given of integrated electronic components, each having high speed differential circuits. Each integrated electronic component or simply referred to as "electronic component" includes a group of BGA terminals such as the pad group 21 of FIG. 4. Each pitch between pads for individual terminals arranged in a grid pattern is set to "d" mm.

First Exemplary Embodiment

Figure 5:
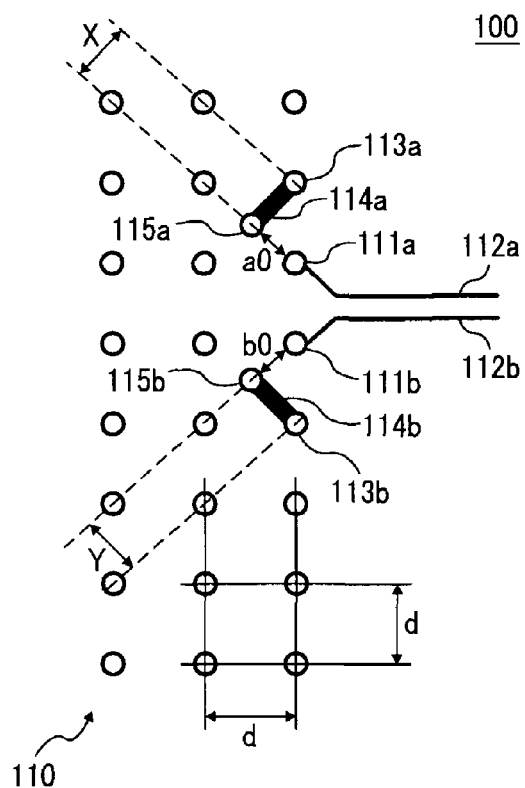
FIG. 5 is a schematic configuration of a multilayer printed wiring board according to a first exemplary embodiment of this patent specification.

Referring to FIG. 5, a schematic structure of a multilayer printed wiring board or PWB 100 according to a first exemplary embodiment of this patent specification is described.

FIG. 5 illustrates an enlarged view of a layout of a group of pads for mounting electronic components on the PWB 100, which serves as a target board to be measured by a measuring instrument.

In FIG. 5, the PWB 100 includes multiple pads for ground (hereinafter, each referred to as a "ground pad"), multiple pads for high-speed differential signals (hereinafter, each referred to as a "signal pad"), and multiple vias. Specifically, the PWB 100 shown in FIG. 5 includes, on a layout, a pad group 110, a pair of transmission line patterns or signal trace patterns 112a and 112b, ground pads 113a and 113b, lead wires 114a and 114b, and vias 115a and 115b.

The pad group 110 includes a pair of signal pads for high-speed differential signals, which are a first signal pad 111a and a second signal pad 111b, and the ground pads 113a and 113b. The first signal pad 111a and the second signal pad 111b are formed at a corresponding end of the pair of the signal trace patterns 112a and 112b, respectively, for transmitting high-speed differential signals and are aligned in an endmost line of the pads of the pad group 110. The first signal pad 111a for high-speed differential signals is connected to the signal trace pattern 112a, and the second signal pad 111b for high-speed differential signals is connected to the signal trace pattern 112b.

In the pad group 110 according to the first exemplary embodiment, a distance "d" between adjacent pads is set to 1 mm.

The pair of signal trace patterns 112a and 112b correspond to high speed differential signal paths on the PWB 100.

The ground pads 113a and 113b are located in proximity to each other and next to the first signal pad 111a and second signal pad 111b for high-speed differential signals in the endmost line of the pads of the pad group 110 on the PWB 100. Specifically, the ground pad 113a resides next to the first signal pad 111a for high-speed differential signals and the ground pad 113b resides next to the second signal pad 111b for high-speed differential signals in the endmost line.

The lead wires 114a and 114b are led out from the ground pads 113a and 113b, respectively. One end of the lead wire 114a is connected to the ground pad 113a, and the other end of the lead wire 114a is connected to the via 115a. Similarly, one end of the lead wire 114b is connected to the ground pad 113b, and the other end of the lead wire 114b is connected to the via 115b.

Each of the vias 115a and 115b runs across a thickness of the PWB 100, so that a lower end of each of the vias 115a and 115b can be connected to an inner layer ground pattern, not shown.

With the above-described structure, inductance of a lead wire of an electronic component from a ground pad thereof to the inner layer ground pattern through a via can be reduced and equilibrium of high-speed differential signals can be obtained.

Though not shown in FIG. 5, the inner layer ground pattern is provided on an inner layer that is located in proximity to a front surface conductive layer. That is, the inner layer ground pattern is provided close to but sufficiently spaced apart from a given area onto which the pair of signal trace patterns 112a and 112b, the first signal pad 111a, the second signal pad 111b, and the vias 115a and 115b are formed to flow high frequency signals. If necessary, the lead wires 114a and 114b, and the ground pads 113a and 113b are also projected to the given area.

In the first exemplary embodiment of this patent specification, each pitch between the multiple pads of the pad group 110 is set to "d" mm. Further, a distance "a0" between the first signal pad 111a for high-speed differential signals and the via 115a and a distance "b0" between the second signal pad 111b for high-speed differential signals and the via 115b are designed to be substantially equal to each other. Furthermore, a length or distance "X" of the lead wire 114a led from the ground pad 113a to the via 115a and a length or distance "Y" of the lead wire 114b led from the ground pad 113b to the via 115b are also set to be substantially equal to each other.

Specifically, when the pitch of adjacent pads of the pad group 110 is "d" mm, the vias 115a and 115b are arranged respectively at positions where the distances "a0", "b0", "X", and "Y" satisfy a relation expressed as "d/√2 (mm)", which corresponds, for example, to (1/√2) times the distance "d" between the first signal pad 111a and the second signal pad 111b.

Next, a description is given of return current paths of the pair of signal trace patterns 112a and 112b constituting high speed differential signal paths. The return current paths are elements to ensure the equilibrium of the high-speed differential signals. The return current of the signal trace pattern 112a may flow on the inner layer ground pattern disposed immediately below the signal trace pattern 112a to reach a position immediately below the first signal pad 111a for high-speed differential signals. The return current of the signal trace pattern 112a may further flow from the first signal pad 111a for high-speed differential signals through the via 115a that is connected to the inner layer ground pattern and through the lead wire 114a to the ground pad 113a.

Similarly, the return current of the signal trace pattern 112b may flow on the inner layer ground pattern disposed immediately below the signal trace pattern 112b to reach a position immediately below the second signal pad 111b for high-speed differential signals. The return current of the signal trace pattern 112b may further flow from the second signal pad 111b for high-speed differential signals through the via 115b that is connected to the inner layer ground pattern and through the lead wire 114b to the ground pad 113b.

To reduce an adverse affect that may be caused by different lengths of the return current paths flowing on the pair of signal trace patterns 112a and 112b for high-speed differential signals, the distance "a0" between the first signal pad 111a for high-speed differential signals and the via 115a and the distance "b0" between the second signal pad 111b for high-speed differential signals and the via 115b are set to be substantially equal to each other. In addition, the distance "X" of the lead wire 114a between the ground pad 113a and the via 115a and the distance "Y" of the lead wire 114b between the ground pad 113b and the via 115b are also set to be substantially equal to each other in the layout on the PWB 100 according to the first exemplary embodiment of this patent specification.

The inventors of the present invention studied and evaluated effects on output waveforms. The inventors used various target boards 60 to evaluate the output waveforms of loss-frequency under the condition of the structure according to the first exemplary embodiment in which the distances or lengths of the lead wires between the ground pads and the vias connected to the inner layer ground pattern are substantially equal to each other and under the condition in which the path lengths of return current are different.

The target boards 60 used for the tests were a printed wiring board having a pad group similar to that shown in FIG. 5. That is, each of the target boards 60 had a pad group including multiple pads with the distance "d" of 1 mm as shown in FIG. 5. The target boards 60 had the identical distance "X" of the lead wire between the ground pad and the via connected to the inner layer ground pattern. The distance "X" on the target boards 60 was set to 0.7 mm, which corresponds to 1/√2. At the same time, the target boards 60 had the various distances "Y" of the lead wire between the ground pad and the via connected to the inner layer ground pattern. The distance "Y" of one of the target boards 60 was set to 0.7 mm, which also corresponds to 1/√2. The distances "Y" of the other target boards 60 were set to various values each greater than 0.7 mm.

Figure 6:
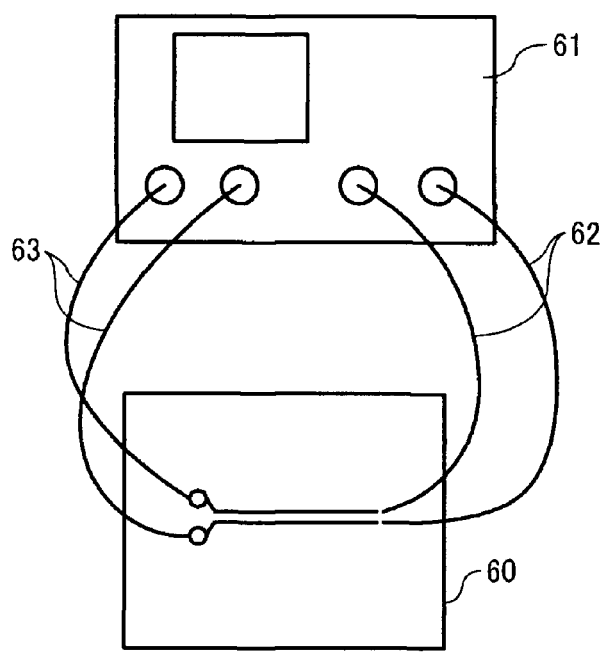
FIG. 6 is a schematic structure of a measuring system for measuring actual values of loss in transmission on signal traces of high-speed differential signals.

FIG. 6 illustrates a measuring instrument or system for measuring actual values of losses in transmission on signal traces of high-speed differential signals.

A measuring instrument 61 shown in FIG. 6 may be any kind of device or instrument capable of measuring and obtaining actual values of affects on waveforms output from a printed wiring board connected to the measuring instrument 61, such as a vector network analyzer. Cables 62 of the measuring instrument 61 are connected respectively to the ends of signal trace patterns for high-speed differential signals on one of the target boards 60. Cables 63 of the measuring instrument 61 are connected respectively to signal pads for high-speed differential signals on the target board 60. With the above-described structure, the measuring instrument 61 can obtain mixed-mode scattering parameters (S-parameters) of the signal trace patterns of the transmission lines for high-speed differential signals on the target board 60.

Figure 7:
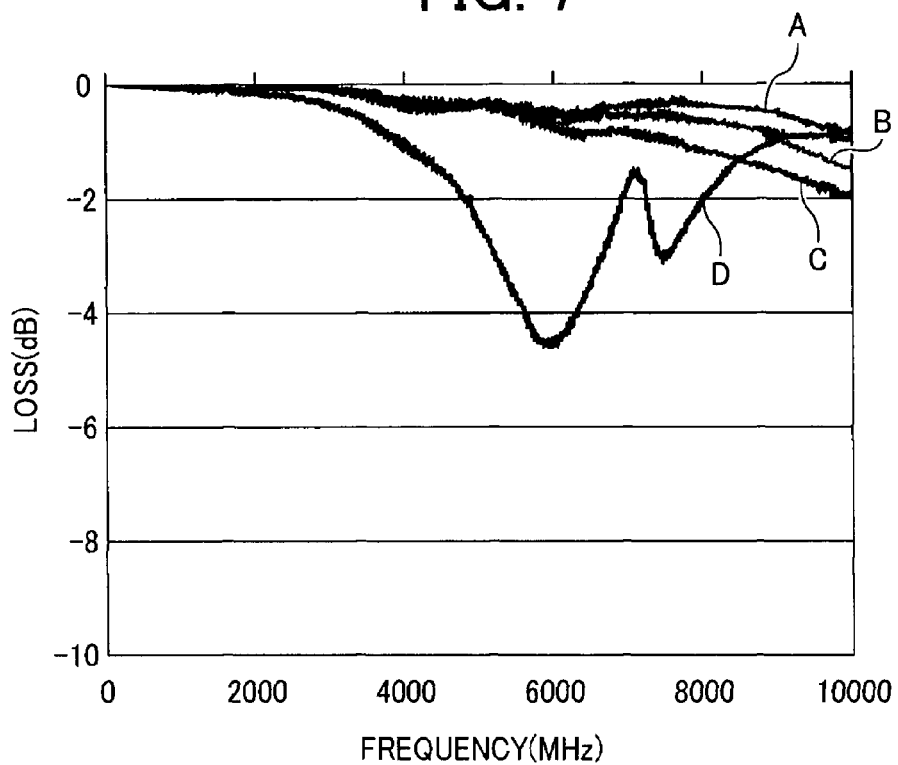
FIG. 7 is a graph showing frequency characteristics indicating losses in transmission on signal traces of high-speed differential signals.

FIG. 7 illustrates a graph showing observed frequency characteristics with respect to transmission losses on high speed differential signal traces with the various distances "Y" from the ground pad to the via.

In the graph of FIG. 7, a frequency characteristic A in a waveform shows the transmission loss of the target board 60 with the distance "X" of 0.7 mm and the distance "Y" of 0.7 mm, a frequency characteristic B shows the transmission loss of the target board 60 with the distance "X" of 0.7 mm and the distance "Y" of 1.4 mm, a frequency characteristic C shows the transmission loss of the target board 60 with the distance "X" of 0.7 mm and the distance "Y" of 3 mm, and a frequency characteristic D shows the transmission loss of the target board 60 with the distance "X" of 0.7 mm and the distance "Y" of 10 mm.

According to the results of the above-described tests with the target boards 60 having various distances "Y", the inventors found that the loss of the target board 60 increased as the distance "Y" of the lead wire became longer. The inventors also found that, when the distance or length of one lead wire was extremely long (for example, 10 mm), the loss abruptly increased around 4 GHz to 8 GHz.

As described above, as the distance or length of the lead wire from the ground pad to the via increases, the transmission loss in high frequency band of the board increases due to effects of inductance components. Therefore, the lengths of return current paths of each signal trace pattern for transmitting high-speed differential signals become different. Therefore, the balance or equilibrium of differential signals may become low, which can increase the transmission loss. Accordingly, the inventors have confirmed that, when the target board 60 has the layout according to the first exemplary embodiment, sufficient transmission characteristics can be obtained.

According to the layout of the printed wiring board 100 as shown in FIG. 5, when the lengths of return current paths of the pair of signal trace patterns 112a and 112b constituting high-speed differential signals have the same lengths for return current paths thereof, the equilibrium of the high-speed differential signals can be secured. Further, the equilibrium of the high-speed differential signals can be secured when the distance "a0" between the first signal pad 111a for high-speed differential signals and the via 115a connected to the inner layer ground pattern and the distance "b0" between the second signal pad 111b for high-speed differential signals and the via 115b connected to the inner layer ground patterns are set to be substantially equal to each other and the distance "X" of the lead wire 114a between the ground pad 113a and the via 115a and the distance "Y" of the lead wire 114b between the ground pad 113b and the via 115b are also set to be substantially equal to each other. Accordingly, the distances "a0", "b0", "X", and "Y" are set to be substantially equal to each other in the exemplary embodiments.

Next, the inventors of the present invention also studied and evaluated effects on transmission characteristics according to various path lengths of return current flowing on the pair of signal trace patterns 112a and 112b for high-speed differential signals while the lengths of adjacent paths are identical to each other, which is same as those of the first exemplary embodiment. Specifically, the target boards 60 used in the tests substantially corresponded to the structure of the PWB 100 of FIG. 5. Since the target boards 60 are substantially same as the PWB 100, the elements and components of the target boards 60 may be denoted by the same reference numerals as those of the PWB 100 and the descriptions thereof are omitted or summarized.

As described above, the tests were conducted to study the effects on transmission characteristics according to various path lengths of return current flowing on the pair of signal trace patterns 112a and 112b for high-speed differential signals while the lengths of adjacent paths are identical to each other. In the tests, the pitch "d" of the pads in the pad group 110 of each target board 60 was set to 1 mm, the distance "a0" between the first signal pad 111a for high-speed differential signals and the via 115a connected to the inner layer ground pattern and the distance "b0" between the second signal pad 111b for high-speed differential signals and the via 115b connected to the inner layer ground pattern were set to d/√2 mm to be set to be substantially equal to each other, and the distance "X" of the lead wire 114a between the ground pad 113a and the via 115a and the distance "Y" of the lead wire 114b between the ground pad 113b and the via 115b were set to d/√2 mm to be set to be substantially equal to each other. In the tests, both the distance "X" and the distance "Y" were equally varied to be greater than d/√2 mm.

Figure 8:
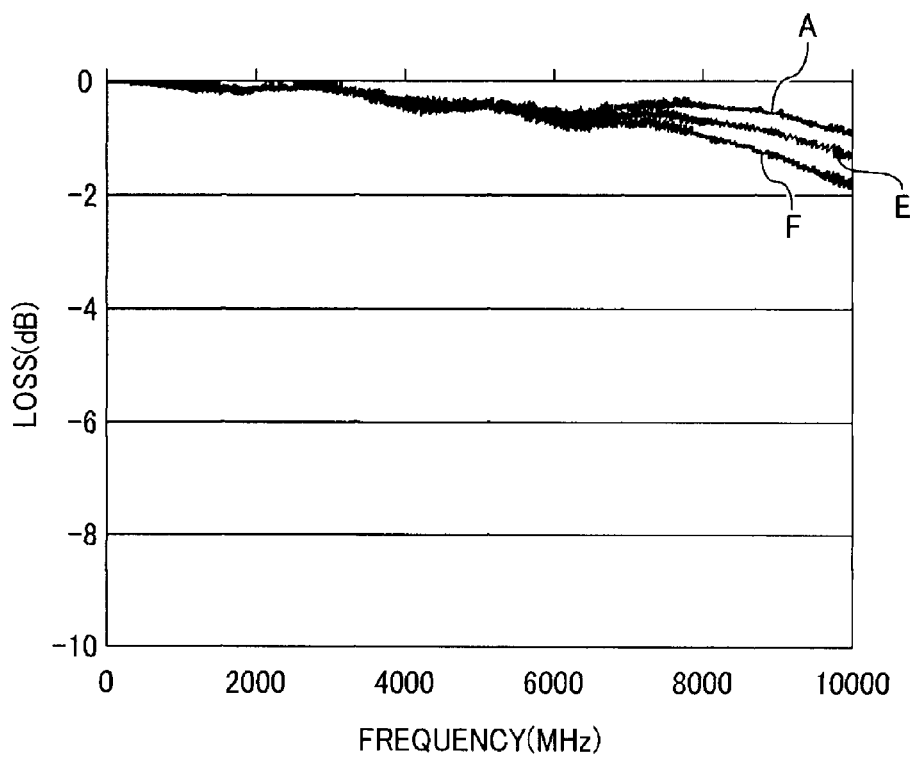
FIG. 8 is a graph showing observed relations of characteristics between frequency and loss in transmission on signal traces of high-speed differential signals with different distances between a ground pad and a via.

FIG. 8 illustrates a graph showing observed frequency characteristics with respect to transmission losses (combined differential-mode and common-mode scattering parameters or mixed-mode S-parameters) on high speed differential signal traces with the various distances "X" and "Y" from the ground pad to the via.

In the graph of FIG. 8, the frequency characteristic A in a waveform shows the transmission loss of the target board 60 with the distance "X" of 0.7 mm and the distance "Y" of 0.7 mm as set in the previous test in reference to the graph of FIG. 7, a frequency characteristic E shows the transmission loss of the target board 60 with the distance "X" of 1.4 mm and the distance "Y" of 1.4 mm, and a frequency characteristic F shows the transmission loss of the target board 60 with the distance "X" of 3.0 mm and the distance "Y" of 3.0 mm.

According to the results of the above-described tests with the target boards 60 having various distances "X" and "Y", the inventors found that the transmission losses of the target board 60 increased in a frequency band higher than approximately 6 GHz as the distances "X" and "Y" of the lead wire from the ground pad to the via became longer. The inventors also found that that, when the distance or length of one lead wire became shorter, the inductance of the lead wire was reduced. Accordingly, the inventors have confirmed that, when the target board 60 has the layout according to the first exemplary embodiment, sufficient frequency characteristics of the high speed differential signal traces can be obtained.

According to the results described above, it has been found that a preferable position of a via may be at a position where the distance or length of a lead wire between a ground pad and a via connected to an inner layer ground pattern may be shorter and path lengths of return current that flows on each signal trace pattern for high-speed differential signals may be substantially equal to each other.

In the first exemplary embodiment, the path lengths of return current that flows on the pair of signal trace patterns 112a and 112b for high-speed differential signals are set to be identical so as to obtain or maintain the equilibrium of the high-speed differential signals. Further, the distances "a0" and "b0" representing the distances or lengths between the first signal pad 111a and the via 115a and between the second signal pad 111b and the via 115b, respectively, and the distances "X" and "Y" representing the distances or lengths of the lead wire 114a between the ground pad 113a and the via 115a and of the lead wire 114b between the ground pad 113b and the via 115b, respectively, are sufficiently short from a practical viewpoint. Therefore, the transmission losses in the high frequency band of the high speed differential signal traces on the PWB 100 caused by the inductance components can be reduced, thereby obtaining fidelity in output waveforms.

The layout of a PWB is not limited to the layout of the PWB 100 according to the first exemplary embodiment. That is, by setting a distance between a first signal pad for high-speed differential signals and a first via connected to a inner layer ground pattern and a distance between a second signal pad for high-speed differential signals and a second via connected to the inner layer ground pattern to be substantially equal to each other, the path lengths of return current that flows on each signal trace pattern for high-speed differential signals may be substantially equal to each other. By so doing, the equilibrium of the high-speed differential signals can be secured. Accordingly, different layouts can achieve a same effect as the layout of the PWB 100.

Further, by laying out the length of a return current path to be short as possible, degradation of transmission characteristics of a PWB can be prevented.

In the first exemplary embodiment, the pad group 110 provided for mounting electronic components is square-shaped and arranged in a grid pattern. However, the arrangement of the multiple pads of the pad group 110 is not limited to. For example, the present patent specification can be applied to a pad group with multiple pads arranged in a zigzag manner in two dimensions.

Second Exemplary Embodiment

Figure 9:
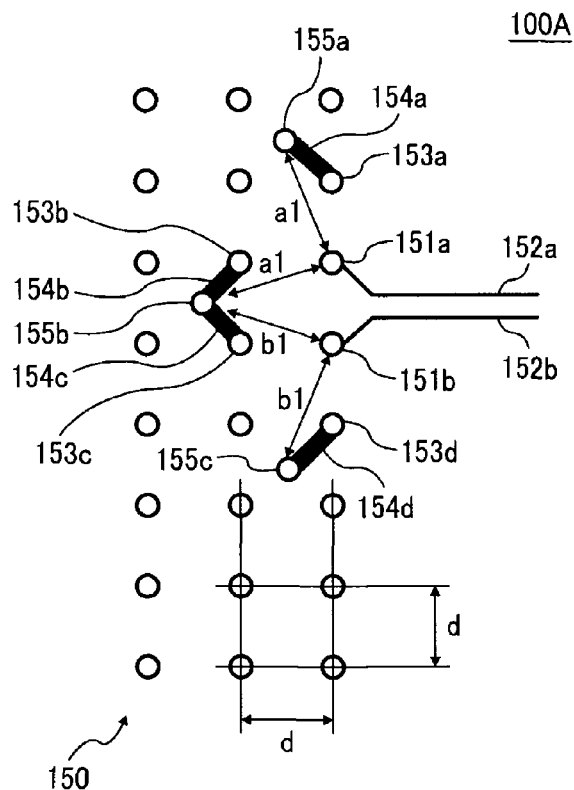
FIG. 9 is a schematic configuration of a multilayer printed wiring board according to a second exemplary embodiment of this patent specification.

Referring to FIG. 9, a schematic structure of a multilayer PWB 100A according to a second exemplary embodiment of this patent specification is described.

FIG. 9 illustrates a partially enlarged view of a layout of a group of pads for mounting electronic components on the PWB 100A. The structure of the PWB 100A is basically same as the structure of the PWB 100, except that vias on the PWB 100A are arranged in zigzag lines or staggered lines sandwiching a line of pads. Therefore, some descriptions of elements and components of the PWB 100A may be omitted or summarized.

In FIG. 9, the PWB 100A includes a pad group 150, a pair of transmission line patterns or signal trace patterns 152a and 152b, ground pads 153a through 153d, lead wires 154a through 154d, and vias 155a through 155c.

The pad group 150 includes a pair of signal pads for high-speed differential signals, which are a first signal pad 151a and a second signal pad 151b, and the ground pads 153a through 153d.

The first signal pad 151a and the second signal pad 151b are formed at a corresponding end of each of the pair of signal trace patterns 152a and 152b, respectively, for transmitting high-speed differential signals and are aligned in an endmost line of the pads of the pad group 150. In other words, the first signal pad 151a for high-speed differential signals is connected to the signal trace pattern 152a, and the second signal pad 151b for high-speed differential signals is connected to the signal trace pattern 152b.

The pair of signal trace patterns 152a and 152b correspond to high speed differential signal paths on the PWB 100A.

The ground pads 153a and 153d are located in proximity to each other and next to the first signal pad 151a and second signal pad 151b for high-speed differential signals in the endmost line of the pads of the pad group 150 on the PWB 100A. Specifically, the ground pad 153a resides next to the first signal pad 151a for high-speed differential signals and the ground pad 153d resides next to the second signal pad 151b for high-speed differential signals in the endmost line.

The ground pads 153b and 153c are located in proximity to each other in a line next to the endmost line of the pads of the pad group 150, and arranged next to the first signal pad 151a and second signal pad 151b for high-speed differential signals, respectively.

The lead wires 154a through 154d are led out from the ground pads 153a through 153d, respectively. One end of the lead wire 154a is connected to the ground pad 153a, and the other end of the lead wire 154a is connected to the via 155a. Similarly, one end of the lead wire 154b is connected to the ground pad 153b, and the other end of the lead wire 154b is connected to the via 155b. One end of the lead wire 154c is connected to the ground pad 153c, and the other end of the lead wire 154c is connected to the via 155b. One end of the lead wire 154d is connected to the ground pad 153d, and the other end of the lead wire 154d is connected to the via 155c.

Each of the vias 155a through 155c runs across a thickness of the PWB 100A, so that a lower end of each of the vias 155a through 155c can be connected to the inner layer ground pattern.

In the second exemplary embodiment of this patent specification, each pitch between adjacent pads of the multiple pads of the pad group 150 is set to "d" mm. Further, a distance "a1" between the first signal pad 151a for high-speed differential signals and the via 155a and between the first signal pad 151a for high-speed differential signals and the via 155b and a distance "b1" between the second signal pad 151b for high-speed differential signals and the via 155b and between the second signal pad 151b for high-speed differential signals and the via 155c are substantially equal to each other.

Specifically, when the pitch of adjacent pads of the pad group 150 is "d" mm, the vias 155a through 155c may be arranged respectively at positions where the distances "a1" and "b1" satisfy a relation expressed as "$\sqrt{2.5} * d$ (mm)", which corresponds, for example, to $\sqrt{2.5}$ times the distance "d" between the first signal pad 151a and the second signal pad 151b.

In the layout of the PWB 100A according to the second exemplary embodiment, the lengths of return current paths with respect to the pair of signal trace patterns 152a and 152b for high-speed differential signals are substantially equal to each other so that the equilibrium of the high-speed differential signals can be obtained.

Third Exemplary Embodiment

Figure 10:
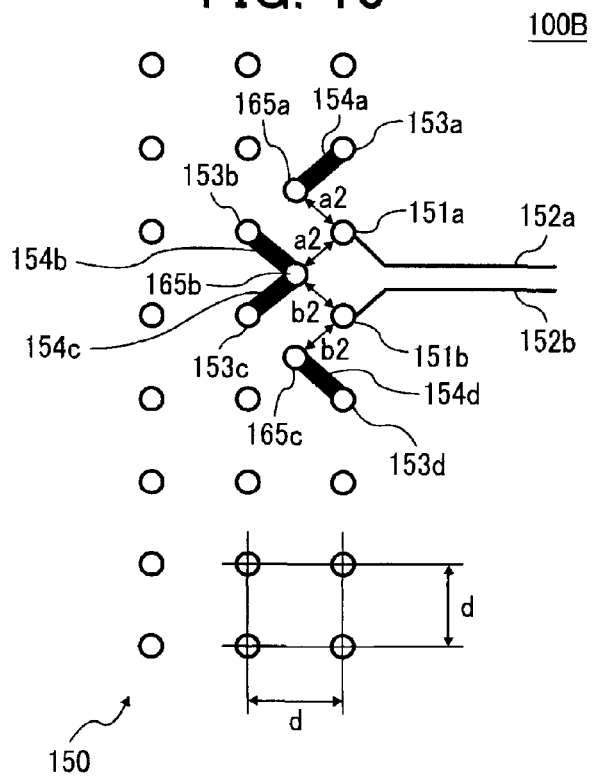
FIG. 10 is a schematic configuration of a multilayer printed wiring board according to a third exemplary embodiment of this patent specification.

Referring to FIG. 10, a schematic structure of a multilayer PWB 100B according to a third exemplary embodiment of this patent specification is described.

FIG. 10 illustrates a partially enlarged view of a layout of a group of pads for mounting electronic components on the PWB 100B. The structure of the PWB 100B is basically same as the structure of the PWB 100A of FIG. 9, except that the vias on the PWB 100A are arranged in a grid pattern with straight lines and that the lengths of return current paths on which each signal trace pattern for high-speed differential signals flows are shorter than those in the PWB 100A. Therefore, some descriptions of elements and components of the PWB 100B may be omitted or summarized.

In FIG. 10, the PWB 100B includes the pad group 150, the pair of transmission line patterns or signal trace patterns 152a and 152b, the ground pads 153a through 153d, the lead wires 154a through 154d, and vias 165a through 165c.

Instead of the vias 155a through 155c of the PWB 100A of FIG. 9, the PWB 100B includes the vias 165a through 165c. One end of the lead wire 154a is connected to the ground pad 153a, and the other end of the lead wire 154a is connected to the via 165a. One end of the lead wire 154b is connected to the ground pad 153b, and the other end of the lead wire 154b is connected to the via 165b. One end of the lead wire 154c is connected to the ground pad 153c, and the other end of the lead wire 154c is connected to the via 165b. One end of the lead wire 154d is connected to the ground pad 153d, and the other end of the lead wire 154d is connected to the via 165c.

Each of the vias 165a through 165c runs across a thickness of the PWB 100B, so that a lower end of each of the vias 165a through 165c can be connected to the inner layer ground pattern.

In the third exemplary embodiment of this patent specification, each pitch between adjacent pads of the multiple pads of the pad group 150 is set to "d" mm. Further, a distance "a2" between the first signal pad 151a for high-speed differential signals and the via 165a and between the first signal pad 151a for high-speed differential signals and the via 165b and a distance "b2" between the second signal pad 151b for high-speed differential signals and the via 165b and between the second signal pad 151b for high-speed differential signals and the via 165c are substantially equal to each other.

Specifically, when the pitch of adjacent pads of the pad group 150 is "d" mm, the vias 165a through 165c may be arranged respectively at positions where the distances "a2" and "b2" satisfy a relation expressed as "d/√2 (mm)", which corresponds, for example, to 1/√2 times the distance "d" between the first signal pad 151a and the second signal pad 151b.

In the layout of the PWB 100B as shown in FIG. 10 according to the third exemplary embodiment, the distance "a2" between the first signal pad 151a for high-speed differential signals and the via 165a connected to the inner layer ground pattern and between the first signal pad 151a for high-speed differential signals and the via 165b connected to the inner layer ground pattern, the distance "b2" between the second signal pad 151b for high-speed differential signals and the via 165b connected to the inner layer ground pattern and between the second signal pad 151b for high-speed differential signals and the via 165c connected to the inner layer ground pattern, and the lengths of the lead wires 154a through 154d are substantially equal to each other. By so doing, the lengths of the lead wires 154a through 154d may be sufficiently short from a practical viewpoint, thereby reducing inductance in the lead wires 154a through 154d. Further, the lengths of return current paths with respect to the pair of signal trace patterns 152a and 152b for high-speed differential signals can have the same lengths of return current paths, and therefore the equilibrium of the high-speed differential signals can be secured. Accordingly, degradation of transmission characteristics of a PWB can be prevented.

The above-described layout is not limited to but the present patent specification can apply to a different layout. For example, the present patent specification can apply to a layout in which a lead wire connects the via 165a and the ground pad 153b and another lead wire connects the via 165c and the ground pad 153c. This layout satisfies the above-described condition so as to achieve the above-described effect.

Fourth Exemplary Embodiment

Figure 11:
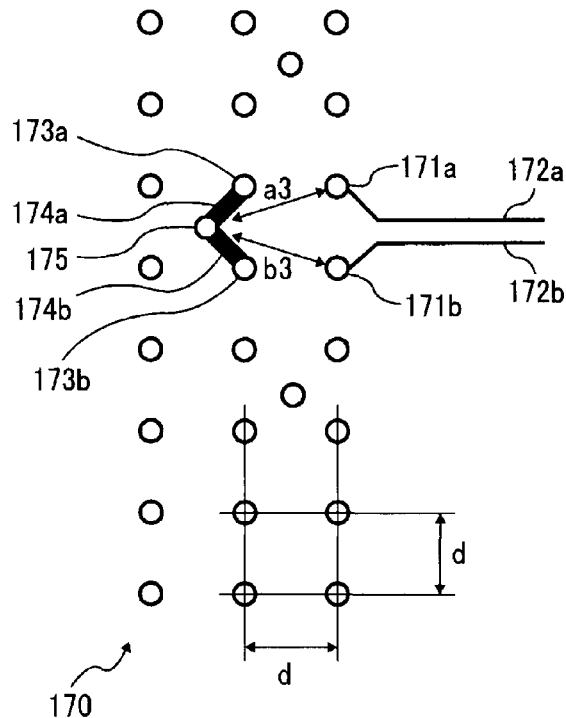
FIG. 11 is a schematic configuration of a multilayer printed wiring board according to a fourth exemplary embodiment of this patent specification.

Referring to FIG. 11, a schematic structure of a multilayer PWB 100C according to a fourth exemplary embodiment of this patent specification is described.

FIG. 11 illustrates a partially enlarged view of a layout of a group of pads for mounting electronic components on the PWB 100C. The structure of the PWB 100C is basically same as the structure of the PWB 100A. Therefore, some descriptions of elements and components of the PWB 100C may be omitted or summarized.

Only to cause the lengths of return current paths with respect to signal trace patterns for high-speed differential signals to be equal to each other, it is preferable that a distance between a first signal pad for high-speed differential signals and a via and a distance between a second signal pad and a via are set to be substantially equal to each other.

In FIG. 11, the PWB 100C includes a pad group 170, a pair of transmission line patterns or signal trace patterns 172a and 172b, ground pads 173a and 173b, lead wires 174a and 174b, and vias including a via 175.

The pad group 170 includes a pair of signal pads for high-speed differential signals, which are a first signal pad 171a and a second signal pad 171b, and the ground pads 173a and 173b.

The first signal pad 171a and the second signal pad 171b are formed at a corresponding end of each of the pair of signal trace patterns 172a and 172b, respectively, for transmitting high-speed differential signals and are aligned in an endmost line of the pads of the pad group 170. In other words, the first signal pad 171a for high-speed differential signals is connected to the signal trace pattern 172a, and the second signal pad 171b for high-speed differential signals is connected to the signal trace pattern 172b.

The pair of signal trace patterns 172a and 172b correspond to high speed differential signal paths on the PWB 100C.

The ground pads 173a and 173b are located in proximity to each other in a line next to the endmost line of the pads of the pad group 170, and arranged next to the first signal pad 171a and second signal pad 171b for high-speed differential signals, respectively.

The lead wires 174a and 174b are led out from the ground pads 173a and 173b, respectively. One end of the lead wire 174a is connected to the ground pad 173a, and the other end of the lead wire 174a is connected to the via 175. Similarly, one end of the lead wire 174b is connected to the ground pad 173b, and the other end of the lead wire 174b is connected to the via 175.

The via 175 runs across a thickness of the PWB 100C, so that a lower end of each of the via 175 can be connected to the inner layer ground pattern.

Each pitch between adjacent pads of the multiple pads of the pad group 170 is shown as "d" mm on FIG. 11. Actually, in the fourth exemplary embodiment of this patent specification, each pitch between adjacent pads of the pad group 170 is set to 1 mm. Further, a distance between the first signal pad 171a for high-speed differential signals and the via 175 is set as a distance "a3" and a distance between the second signal pad 171b for high-speed differential signals and the via 175 is set as a distance "b3."

Specifically, when the pitch of adjacent pads of the pad group 170 is "d" mm, the via 175 may be arranged at a position where the distances "a3" and "b3" satisfy a relation expressed as "√2.5*d (mm)", which corresponds, for example, to √2.5 times the distance "d" between the first signal pad 171a and the second signal pad 171b.

In the layout of the PWB 100C as shown in FIG. 11 according to the fourth exemplary embodiment, the distance "a3" between the first signal pad 171a for high-speed differential signals and the via 175 connected to the inner layer ground pattern and the distance "b3" between the second signal pad 171b for high-speed differential signals and the via 175 connected to the inner layer ground pattern are set to be substantially equal to each other, and are equidistant from the via 175. By so doing, the lengths of return current paths with respect to the pair of signal trace patterns 172a and 172b for high-speed differential signals may be substantially equal to each other so that the equilibrium of the high-speed differential signals can be obtained. Further, the inductance in the lead wires 174a and 174b can be sufficiently reduced from a practical viewpoint.

Fifth Exemplary Embodiment

Figure 12:
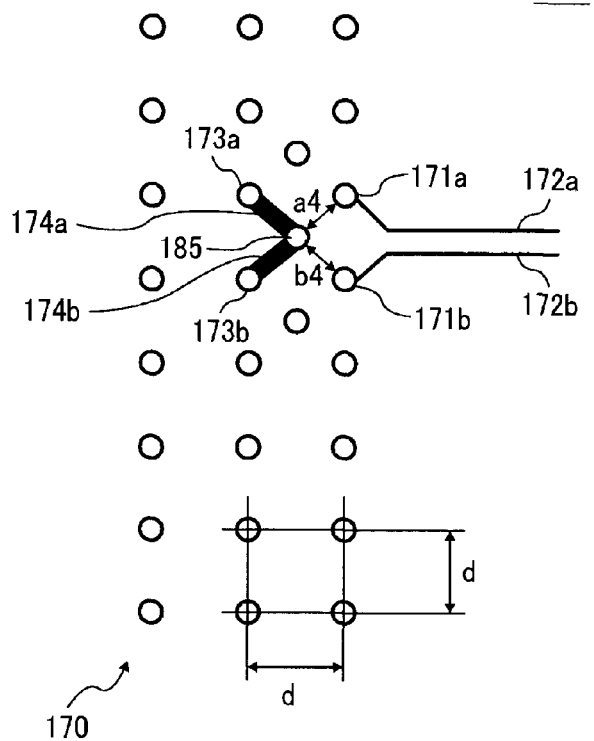
FIG. 12 is a schematic configuration of a multilayer printed wiring board according to a fifth exemplary embodiment of this patent specification.

Referring to FIG. 12, a schematic structure of a multilayer PWB 100D according to a fifth exemplary embodiment of this patent specification is described.

FIG. 12 illustrates a partially enlarged view of a layout of a group of pads for mounting electronic components on the PWB 100D. The structure of the PWB 100D is basically same as the structure of the PWB 100C of FIG. 11, except that vias on the PWB 100D are arranged in a grid pattern with straight lines and that the lengths of return current paths on which each signal trace pattern for high-speed differential signals flows are shorter than those in the PWB 100C. Therefore, some descriptions of elements and components of the PWB 100D may be omitted or summarized.

In FIG. 12, the PWB 100D includes the pad group 170, the pair of transmission line patterns or signal trace patterns 172a and 172b, the ground pads 173a and 173b, the lead wires 174a and 174b, and a vias 185.

Instead of the via 175 of the PWB 100C of FIG. 11, the PWB 100D includes the via 185. One end of the lead wire 174a is connected to the ground pad 173a, and the other end of the lead wire 174a is connected to the via 185. Similarly, one end of the lead wire 174b is connected to the ground pad 173b, and the other end of the lead wire 174b is connected to the via 185.

The via 185 runs across a thickness of the PWB 100D, so that a lower end of each of the via 185 can be connected to the inner layer ground pattern.

In the fifth exemplary embodiment of this patent specification, each pitch between adjacent pads of the multiple pads of the pad group 170 is set to "d" mm. Further, a distance between the first signal pad 171a for high-speed differential signals and the via 185 is set as a distance "a4" and a distance between the second signal pad 171b for high-speed differential signals and the via 185 is set as a distance "b4."

In the layout of the PWB 100D as shown in FIG. 12 according to the fifth exemplary embodiment, the distance "a4", the distance "b4", and the lengths of the lead wires 174a and 174b are set to be substantially equal to each other, and are equidistant from the via 185. Specifically, when the pitch of adjacent pads of the pad group 170 is "d" mm, the via 185 is arranged at a position where the distances "a4" and "b4" and the lengths of the lead wires 174a and 174b satisfy a relation expressed as "d/$\sqrt{2}$ (mm)", which corresponds, for example, to 1/$\sqrt{2}$ times the distance "d" between the first signal pad 171a and the second signal pad 171b. By so doing, the lengths of the lead wires 174a and 174b may be sufficiently short, thereby reducing inductance in the lead wires 174a and 174b. Further, the lengths of return current paths with respect to the pair of signal trace patterns 172a and 172b for high-speed differential signals can have the same lengths of return current paths, and therefore the equilibrium of the high-speed differential signals can be secured.

Sixth Exemplary Embodiment

Figure 13:
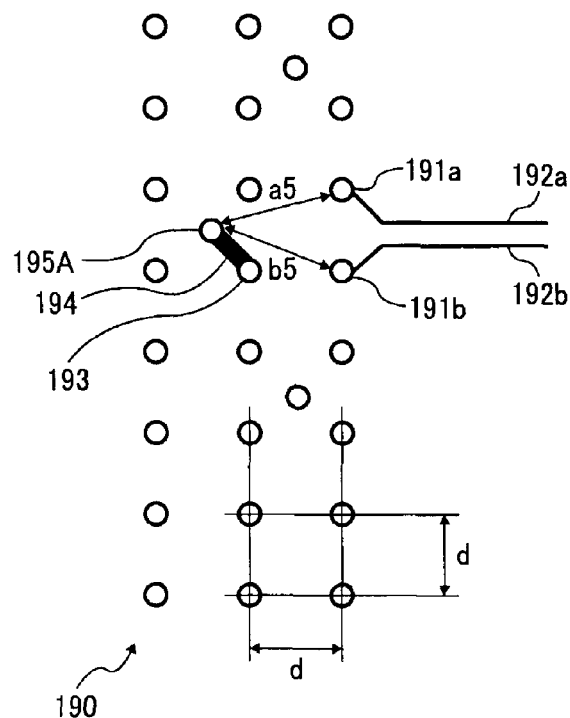
FIG. 13 is a schematic configuration of a multilayer printed wiring board according to a sixth exemplary embodiment of this patent specification.

Referring to FIG. 13, a schematic structure of a multilayer PWB 100E according to a sixth exemplary embodiment of this patent specification is described.

FIG. 13 illustrates a partially enlarged view of a layout of a group of pads for mounting electronic components on the PWB 100E. The structure of the PWB 100E is basically same as the structure of the PWB 100C, except that one via is connected to a ground pad with a lead wire. Therefore, some descriptions of elements and components of the PWB 100E may be omitted or summarized.

Only to cause the lengths of return current paths with respect to signal trace patterns for high-speed differential signals to be equal to each other, it is preferable that a distance between a first signal pad for high-speed differential signals and a via and a distance between a second signal pad and a via are set to be substantially equal to each other.

In FIG. 13, the PWB 100E includes a pad group 190, a pair of transmission line patterns or signal trace patterns 192a and 192b, a ground pad 193, a lead wire 194, and a via 195A.

The pad group 190 includes a pair of signal pads for high-speed differential signals, which are a first signal pad 191a and a second signal pad 191b, and the ground pad 193.

The first signal pad 191a and the second signal pad 191b are formed at a corresponding end of each of the pair of signal trace patterns 192a and 192b, respectively, for transmitting high-speed differential signals and are aligned in an endmost line of the pads of the pad group 190. In other words, the first signal pad 191a for high-speed differential signals is connected to the signal trace pattern 192a, and the second signal pad 191b for high-speed differential signals is connected to the signal trace pattern 192b.

The pair of signal trace patterns 192a and 192b correspond to high speed differential signal paths on the PWB 100E.

The ground pad 193 is located in a line next to the endmost line of the pads of the pad group 190, and arranged next to the second signal pad 191b for high-speed differential signals in FIG. 13.

The lead wire 194 are led out from the ground pad 193. One end of the lead wire 194 is connected to the ground pad 193, and the other end of the lead wire 194 is connected to the via 195A.

The via 195A runs across a thickness of the PWB 100E, so that a lower end of each of the via 195A can be connected to the inner layer ground pattern.

Each pitch between adjacent pads of the multiple pads of the pad group 190 is shown as "d" mm in FIG. 13. Actually, in the sixth exemplary embodiment of this patent specification, each pitch between adjacent pads of the pad group 190 is set to 1 mm. Further, a distance between the first signal pad 191a for high-speed differential signals and the via 195A is set as a distance "a5" and a distance between the second signal pad 191b for high-speed differential signals and the via 195A is set as a distance "b5."

Specifically, when the pitch of adjacent pads of the pad group 190 is "d" mm, the via 195A is arranged at a position where the distances "a5" and "b5" satisfy a relation expressed as "$\sqrt{2.5}$*d (mm)", which corresponds, for example, to $\sqrt{2.5}$ times the distance "d" between the first signal pad 191a and the second signal pad 191b.

In the layout of the PWB 100E as shown in FIG. 13 according to the sixth exemplary embodiment, the lengths of return current paths with respect to the pair of signal trace patterns 192a and 192b for high-speed differential signals can have the same lengths of return current paths, and therefore the equilibrium of the high-speed differential signals can be secured.

Seventh Exemplary Embodiment

Figure 14:
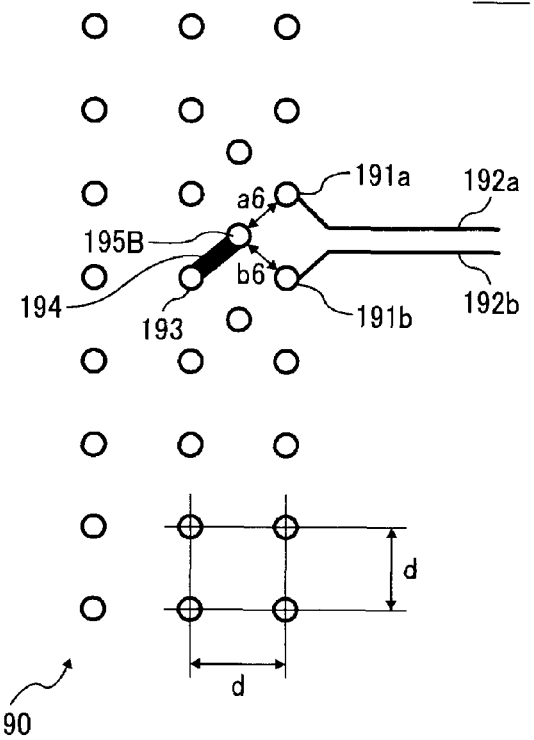
FIG. 14 is a schematic configuration of a multilayer printed wiring board according to a seventh exemplary embodiment of this patent specification.

Referring to FIG. 14, a schematic structure of a multilayer PWB 100F according to a seventh exemplary embodiment of this patent specification is described.

FIG. 14 illustrates a partially enlarged view of a layout of a group of pads for mounting electronic components on the PWB 100F. The structure of the PWB 100F is basically same as the structure of the PWB 100E, except that vias on the PWB 100F are arranged in a straight line closer to the pads aligned in an endmost line, and that a length of a lead wire or a distance between a via and a ground pad is same as a distance between the via and a pad for high-speed differential signals. Therefore, some descriptions of elements and components of the PWB 100F may be omitted or summarized.

In FIG. 14, the PWB 100F includes the pad group 190, the pair of transmission line patterns or signal trace patterns 192a and 192b, the ground pad 193, the lead wire 194, and a vias 195B.

Instead of the via 195A of the PWB 100E of FIG. 13, the PWB 100F includes the via 195B. One end of the lead wire 194 is connected to the ground pad 193, and the other end of the lead wire 194 is connected to the via 195B.

The via 195B runs across a thickness of the PWB 100F, so that a lower end of each of the via 195B can be connected to the inner layer ground pattern.

In the seventh exemplary embodiment of this patent specification, each pitch between adjacent pads of the multiple pads of the pad group 190 is set to "d" mm. Further, a distance between the first signal pad 191a for high-speed differential signals and the via 195B that is led out from the ground pad 193 is set as a distance "a6" and a distance between the second signal pad 191b for high-speed differential signals and the via 195B is set as a distance "b6."

Specifically, when the pitch of adjacent pads of the pad group 190 is "d" mm, the via 195B is arranged at a position where the distance or length of the lead wire 194 between the ground pad 193 and the via 195B, the distances "a6" and "b6" satisfy a relation expressed as "d/√2 (mm)", which corresponds, for example, to d/√2 times the distance "d" between the first signal pad 191a and the second signal pad 191b.

In the layout of the PWB 100F as shown in FIG. 14, the distance "a6" between the first signal pad 191a for high-speed differential signals and the via 195B connected to the inner layer ground pattern, the distance "b6" between the second signal pad 191b for high-speed differential signals and the via 195B connected to the inner layer ground pattern, and the lengths of the lead wire 194 may be set to be substantially equal to each other. By so doing, the lengths of return current paths with respect to the pair of signal trace patterns 192a and 192b for high-speed differential signals may be substantially equal to each other so that the equilibrium of the high-speed differential signals can be obtained. At the same time, the lengths of the lead wire 194 may be sufficiently short from a practical viewpoint, thereby reducing the inductance in the lead wire 194.

As described above, by reducing a distance or length from a ground pad for an electronic component mounted on a PWB, the loss of transmission in the high-frequency band of the high speed differential signal traces on the PWB due to the inductance can be reduced, thereby obtaining high quality in fidelity to output waveforms traveled through transmission lines or signal paths.

Further, by arranging a via or vias so that the lengths of return current paths on which each signal trace pattern for high-speed differential signals flows to be equal to each other, the equilibrium of the high-speed differential signals can be obtained. Accordingly, high quality in fidelity to output waveforms traveled through transmission lines or signal paths can be obtained.

The above-described exemplary embodiments include the pad group with multiple pads arranged to be square-shaped in a grid pattern. However, the arrangement of the multiple pads of the pad group is not limited to the square-shaped grid pattern. For example, the multiple pads can be arranged in a zigzag or staggered pattern extending two-dimensionally.

Further, the pads on the printed wiring patterns according to the above-described exemplary embodiments are for BGA terminals. However, the type of the pads is not limited to the BGA terminal. For example, the type of the pads can be for PGA (pin grid array) terminals. The pads for PGA terminals can be arranged to be square-shaped in the grid pattern, the zigzag pattern, etc.

According to the present patent specification, when the distance from the first signal pad for high-speed differential signals to the via that is connected to the inner layer ground pattern is set as a distance "a" and the distance from the second signal pad for high-speed differential signals to the via that is connected to the inner layer ground pattern is set as a distance "b", the via may be located at a position in which the distances "a" and "b" may be rather short and substantially equal to each other and the distance or length of the lead wire from the via to the ground pad may also be rather short. Accordingly, high quality in fidelity to output waveforms traveled through transmission lines or signal traces can be obtained.

The above-described example embodiments are illustrative, and numerous additional modifications and variations are possible in light of the above teachings. For example, elements and/or features of different illustrative and example embodiments herein may be combined with each other and/or substituted for each other within the scope of this disclosure and appended claims. It is therefore to be understood that within the scope of the appended claims, the disclosure of this patent specification may be practiced otherwise than as specifically described herein.

Obviously, numerous modifications and variations of the present invention are possible in light of the above teachings. It is therefore to be understood that within the scope of the appended claims, the invention may be practiced otherwise than as specifically described herein.

This application claims priority from Japanese patent application No. 2007-184637 filed on Jul. 13, 2007 in the Japan Patent Office, the entire contents of which is hereby incorporated by reference herein.

What is claimed is:

1. A printed wiring board, comprising:
   a pair of signal pads including a first signal pad and a second signal pad formed at a corresponding end of a pair of signal trace patterns on a front side thereof and that transmit differential signals;
   a ground pad formed at a position in proximity to the pair of signal pads; and
   a via that connects the ground pad to a ground pattern formed either on a back side or on an inner layer of the printed wiring board directly or through a lead wire led out from the ground pad,
   the via being substantially equidistant from the first signal pad and the second signal pad,
   wherein the via is substantially equidistant from the first signal pad, the second signal pad and the ground pad and is connected to the ground pad through the lead wire.

2. The printed wiring board according to claim 1, wherein both a first distance between the first signal pad and the via and a second distance between the second signal pad and the via correspond to (1/√2) times a pitch between the first signal pad and the second signal pad.

3. The printed wiring board according to claim 2, wherein a third distance between the ground pad and the via corresponds to (1/√2) times a pitch between the first signal pad and the second signal pad.

4. The printed wiring board according to claim 1, wherein the ground pad comprises multiple ground pads and the lead wire comprises multiple lead wires corresponding to the multiple ground pads,
the via being substantially equidistant from the first signal pad, the second signal pad, and the multiple ground pads, and connected to each of the ground pads through each of the corresponding lead wires.

5. The printed wiring board according to claim 1, wherein multiple pads including the first signal pad, the second signal pad, and the ground pad are arranged in a zigzag line equidistant from each other.

6. The printed wiring board according to claim 1, wherein multiple pads including the first signal pad, the second signal pad, and the ground pad are arranged in a square-shaped grid equidistant from each other.

7. The printed wiring board according to claim 1, wherein multiple pads, including the first signal pad, the second signal pad, and the ground pad, are formed as a pad group for mounting an electronic component with a differential signal terminal.

8. The printed wiring board according to claim 1, wherein the via is formed as a via hole by a through-hole process.

9. The printed wiring board according to claim 1, wherein the via is formed as a conductive via including a conductive material.

10. The printed wiring board according to claim 1, wherein the ground pattern extends immediately below the ground pad.

11. A printed wiring board, comprising:
a pair of signal pads including a first signal pad and a second signal pad formed at a corresponding end of a pair of signal trace patterns on a front side thereof and that transmit differential signals;
a ground pad formed at a position in proximity to the pair of signal pads; and
a via that connects the ground pad to a ground pattern formed either on a back side or on an inner layer of the printed wiring board directly or through a lead wire led out from the ground pad,
the via being substantially equidistant from the first signal pad and the second signal pad,
wherein the ground pad comprises multiple ground pads, the lead wire comprises multiple lead wires, and the via comprises multiple vias that connect each of the multiple ground pads through each of the corresponding lead wires to the ground pattern formed either on the back side or on the inner layer of the printed wiring board through each of the lead wires led out from the corresponding ground pad,
a first via of the multiple vias being located closest to the first signal pad by a first distance and a second via of the multiple vias being located closest to the second signal pad by a second distance substantially equal to the first distance.

12. The printed wiring board according to claim 11, wherein the first via closest to the first signal pad is connected to a first ground pad of the multiple ground pads and the second via closest to the second signal pad is connected to a second ground pad of the multiple ground pads,
the first via separated from the first ground pad by a third distance and the second via separated from the second ground pad by a fourth distance substantially equal to the third distance.

13. The printed wiring board according to claim 11, wherein both the first distance and the second distance correspond to $(1/\sqrt{2})$ times a pitch between the first signal pad and the second signal pad.

14. The printed wiring board according to claim 13, wherein both the third distance and the fourth distance correspond to $(1/\sqrt{2})$ times the pitch between the first signal pad and the second signal pad.

15. An electronic apparatus, comprising:
a printed wiring board comprising:
a pair of signal pads including a first signal pad and a second signal pad formed at a corresponding end of a pair of signal trace patterns on a front side thereof and configured to transmit differential signals;
a ground pad formed at a position in proximity to the pair of signal pads; and
a via configured to connect the ground pad to a ground pattern formed either on a back side or on an inner layer of the printed wiring board directly or through a lead wire led out from the ground pad,
the via being substantially equidistant from the first signal pad and the second signal pad,
wherein the ground pad comprises multiple ground pads, the lead wire comprises multiple lead wires, and the via comprises multiple vias configured to connect each of the multiple ground pads through each of the corresponding lead wires to the ground pattern formed either on the back side or on the inner layer of the printed wiring board through each of the lead wires led out from the corresponding ground pad,
a first via of the multiple vias being located closest to the first signal pad by a first distance and a second via of the multiple vias being located closest to the second signal pad by a second distance substantially equal to the first distance.

16. The electronic apparatus according to claim 15, wherein the first via closest to the first signal pad is connected to a first ground pad of the multiple ground pads and the second via closest to the second signal pad is connected to a second ground pad of the multiple ground pads,
the first via separated from the first ground pad by a third distance and the second via separated from the second ground pad by a fourth distance substantially equal to the third distance.

* * * * *